United States Patent
Deak et al.

(10) Patent No.: US 11,300,637 B2
(45) Date of Patent: Apr. 12, 2022

(54) RESETTABLE BIPOLAR SWITCH SENSOR

(71) Applicant: MultiDimension Technology Co., Ltd., Zhangjiagang (CN)

(72) Inventors: James Geza Deak, Zhangjiagang (CN); Zhimin Zhou, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 0 days.

(21) Appl. No.: 15/733,447

(22) PCT Filed: Jan. 29, 2019

(86) PCT No.: PCT/CN2019/073730
§ 371 (c)(1),
(2) Date: Jul. 30, 2020

(87) PCT Pub. No.: WO2019/149194
PCT Pub. Date: Aug. 8, 2019

(65) Prior Publication Data
US 2021/0103015 A1     Apr. 8, 2021

(30) Foreign Application Priority Data

Jan. 30, 2018   (CN) .......................... 201810088696.6

(51) Int. Cl.
G01R 33/09         (2006.01)
(52) U.S. Cl.
CPC ......... *G01R 33/098* (2013.01); *G01R 33/093* (2013.01)
(58) Field of Classification Search
CPC .............................. G01R 33/093; G01R 33/098
See application file for complete search history.

(56) References Cited

U.S. PATENT DOCUMENTS

2013/0265039 A1*  10/2013  Cai ..................... G01R 33/093
                                                         324/252
2018/0011140 A1    1/2018  Chaware et al.

FOREIGN PATENT DOCUMENTS

CN        203658561              6/2014
CN        106324534 A             1/2017
(Continued)

OTHER PUBLICATIONS

"International Application PCT/CN2019/073730, International Search Report and Written Opinion dated Mar. 26, 2019", (dated Mar. 26, 2019), 13 pgs.

*Primary Examiner* — Minh Q Phan
(74) *Attorney, Agent, or Firm* — Schwegman Lundberg & Woessner, P.A.

(57) ABSTRACT

A resettable bipolar switch sensor is disclosed which comprises a bipolar magnetic hysteresis switch sensor, a reset coil, an ASIC switch circuit and a power reset circuit. The bipolar magnetic hysteresis switch sensor comprises a substrate and a magnetoresistive sensing arm located on the substrate. The magnetoresistive sensing arm is of a two-port structure composed of one or more magnetoresistive sensing unit strings arranged in series, parallel, or series-parallel. The magnetization direction of a free layer of a TMR magnetoresistive sensing unit is determined by an anisotropy field Hk, and together with the magnetization direction of a reference layer and the applied magnetic field, it can orient in an N or S direction. The reset coil is located between the substrate along with the magnetoresistive sensing unit, or it is located on a lead frame below the substrate. The direction of the reset magnetic field is either N or S. The ASIC switch circuit comprises a biasing circuit module, a reading circuit module, and an output circuit module. The power reset circuit is connected to the reset coil. This device (Continued)

has the advantages of low power consumption and small size in addition to the capability to set initial state of the switch sensor.

15 Claims, 11 Drawing Sheets

(56) References Cited

FOREIGN PATENT DOCUMENTS

| | | |
|---|---|---|
| CN | 108089139 A | 5/2018 |
| WO | WO-2019149194 A1 | 8/2019 |

* cited by examiner

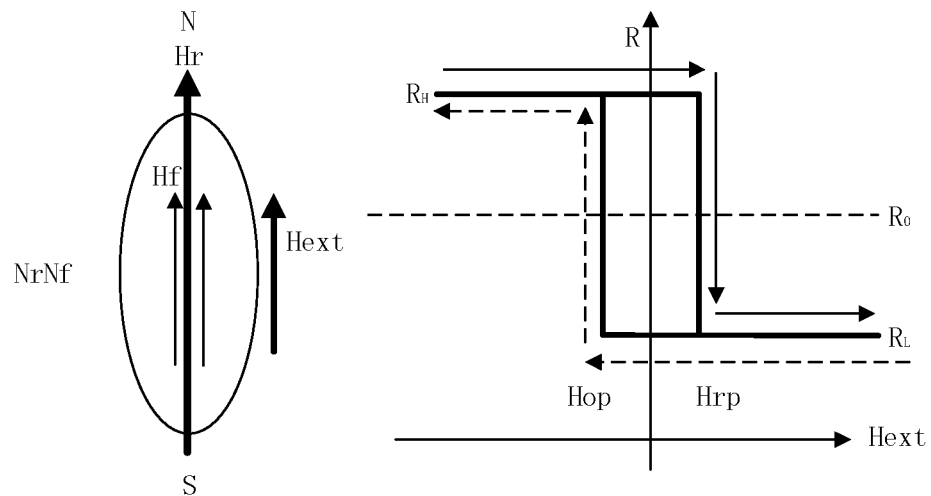
FIG. 4A1          FIG. 4B1
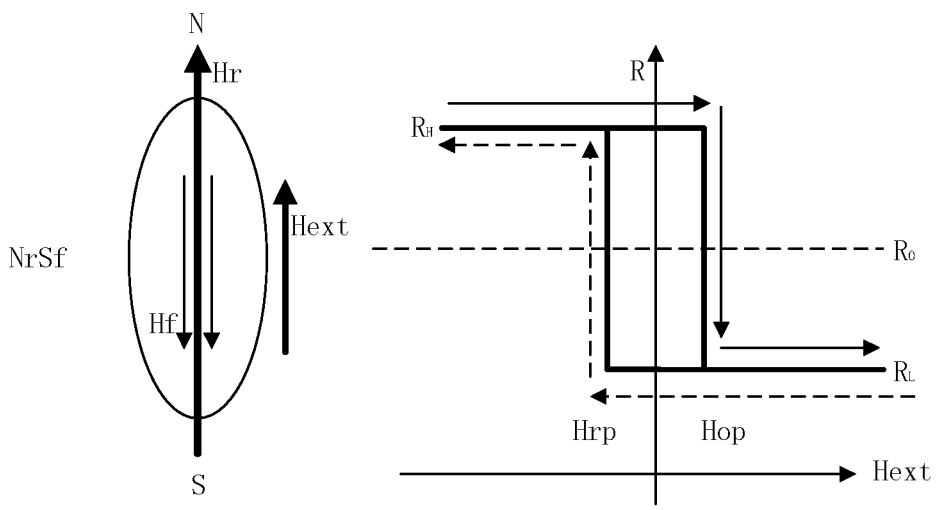
FIG. 4A2          FIG. 4B2

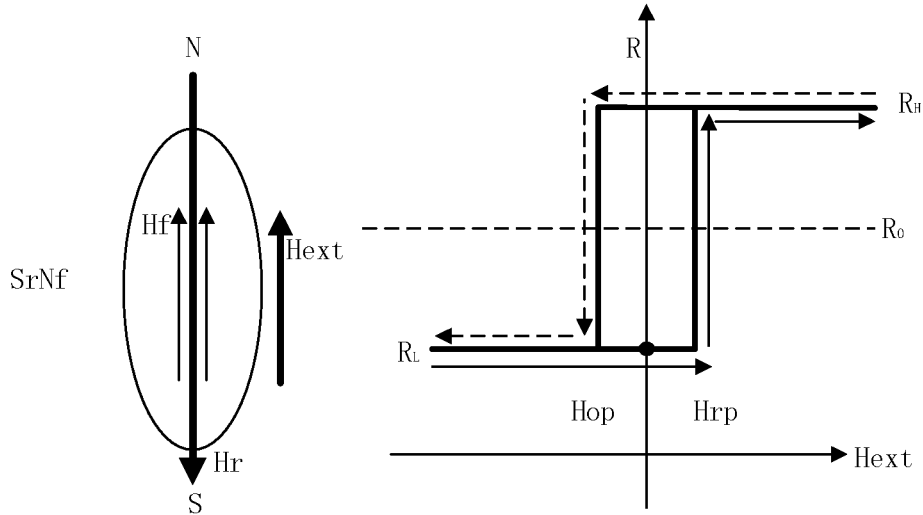
FIG. 4A3        FIG. 4B3
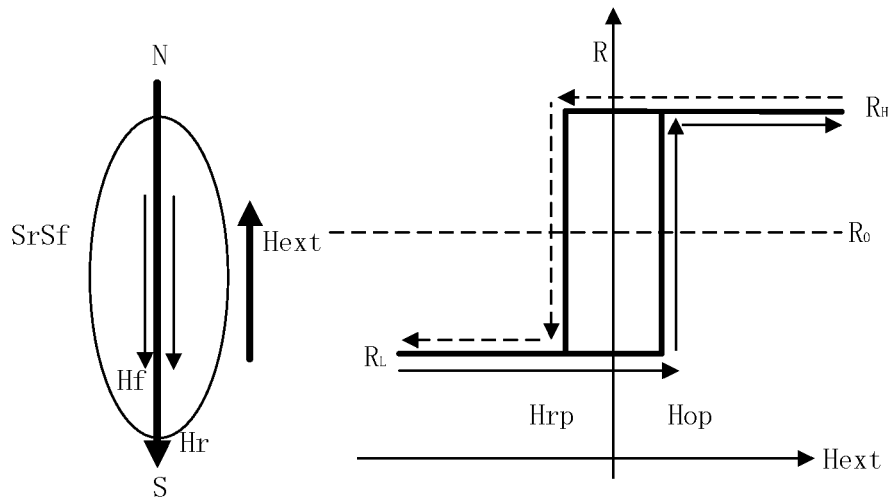
FIG. 4A4        FIG. 4B4

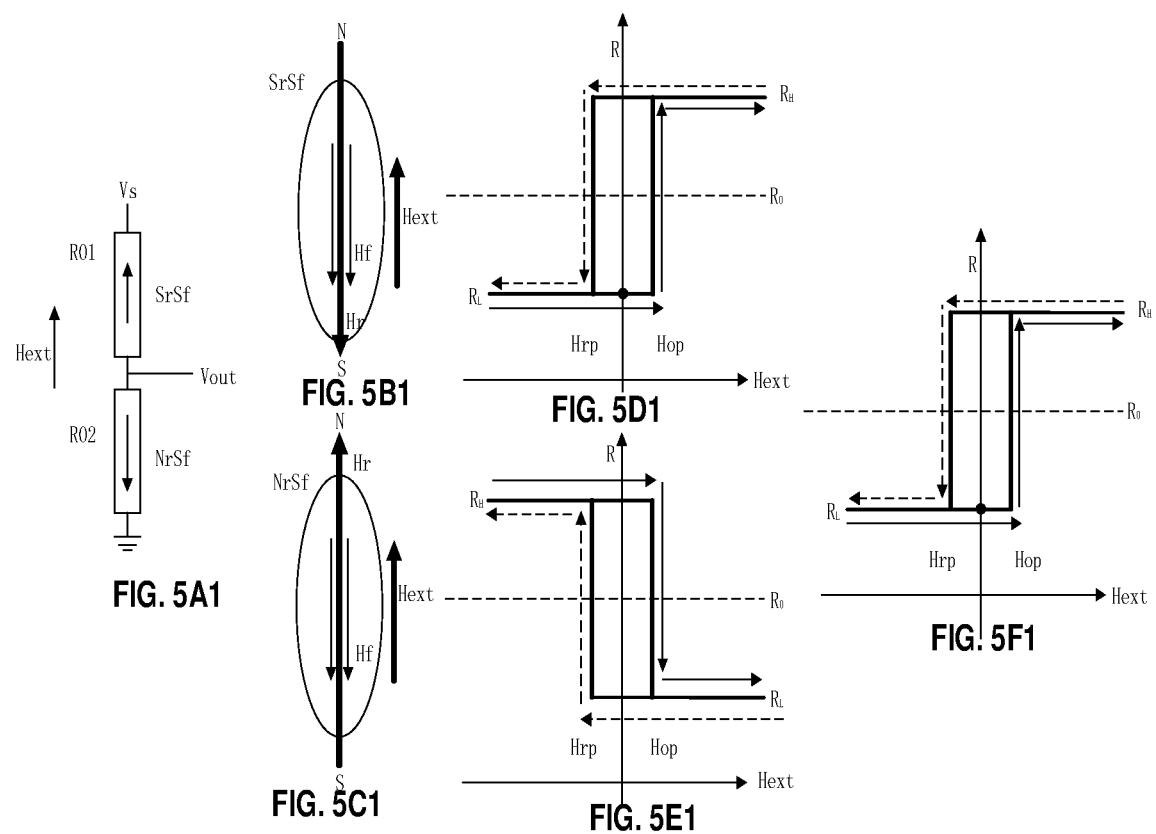

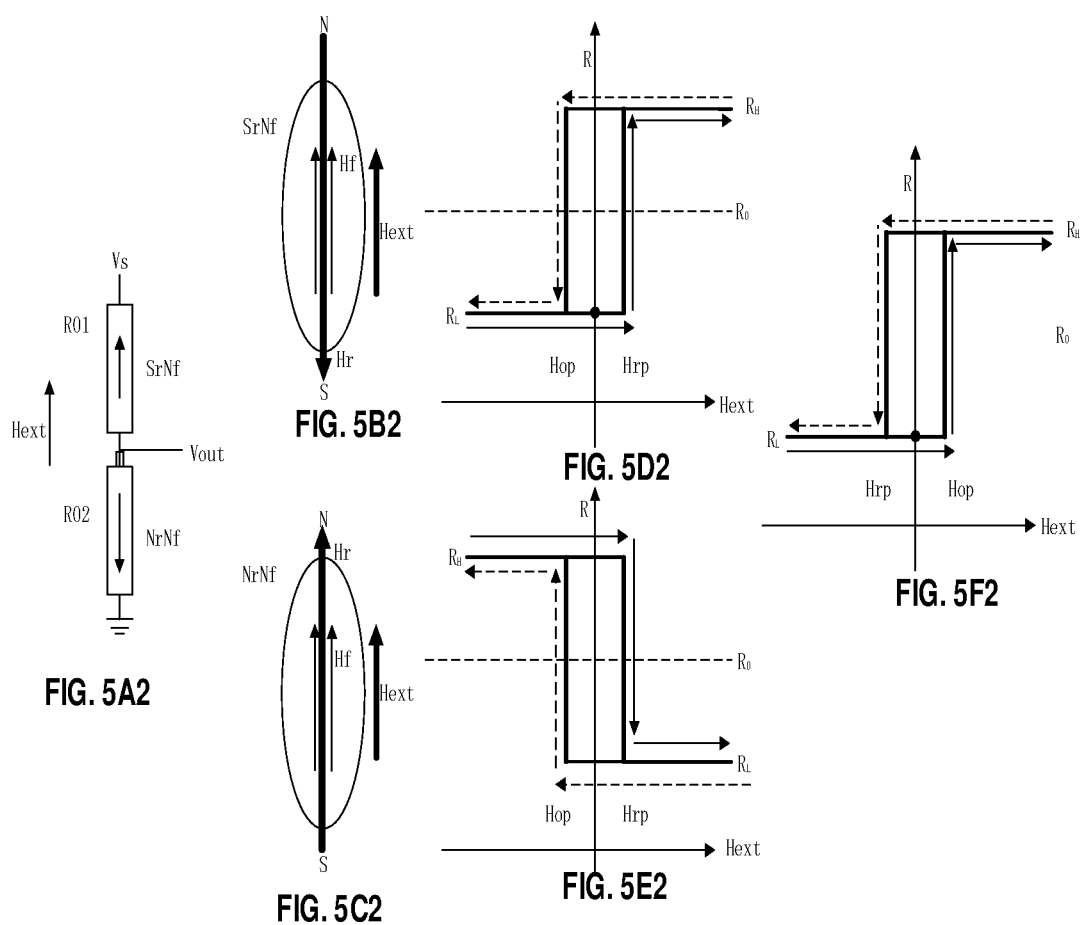

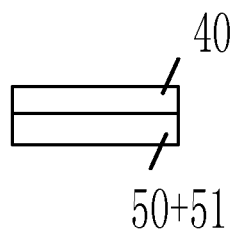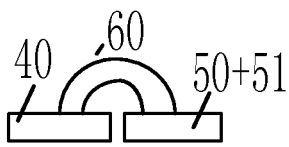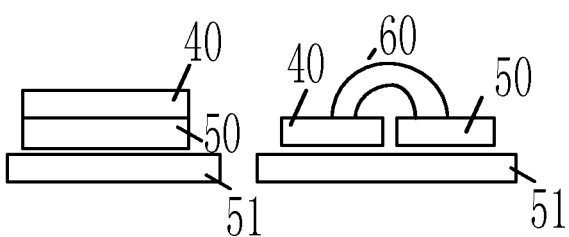
FIG. 14A    FIG. 14B    FIG. 14C    FIG. 14D

RESETTABLE BIPOLAR SWITCH SENSOR

PRIORITY CLAIM TO RELATED APPLICATIONS

This application is a U.S. national stage filing under 35 U.S.C. § 371 from International Application No. PCT/CN2019/073730, filed on 29 Jan. 2019, and published as WO2019/149194 on 8 Aug. 2019, which claims the benefit under 35 U.S.C. 119 to Chinese Application No. 201810088696.6, filed on 30 Jan. 2018, the benefit of priority of each of which is claimed herein, and which applications and publication are hereby incorporated herein by reference in their entirety.

TECHNICAL FIELD

The present invention relates to the field of magnetic sensors, and in particular, to a resettable bipolar switch sensor.

BACKGROUND

Magnetoresistive switch sensors are widely used in fields such as consumer electronics, home appliances, utility meters (electric meters, water meters, and gas meters), automobiles, and various industrial applications. Typical mainstream magnetic switch sensors include Hall sensors and anisotropic magnetoresistance (AMR) sensors. In the fields of consumer electronics and utility-meter applications, the power consumption of Hall switch sensors and AMR switch sensors can reach microamperes. This is obtained at the expense of their operating frequency, which is tens of Hertz. The switching point for these switch sensors is dozens of Gauss. In automobiles, industrial applications, and in environments where high operating frequency is required, the power consumption of Hall switch sensors and AMR switch sensors is in the milliampere range, and their operating frequencies are in the kilohertz range.

Sensors utilizing a tunnel magnetoresistive TMR element as a sensing element have the low power consumption, can work at an operating frequency in kilohertzes or even megahertzes, have power consumption reaching the microampere level and a switch operating point of tens of Gauss, and in addition have high sensitivity and low power consumption, high frequency response, and small size.

A switch sensor generally utilizes a linear magnetoresistive sensor. In a linear working area of an output voltage V and an external magnetic field H, an operating point and a return point magnetic field threshold are set, and a comparator is used to achieve rectangular high-level and low-level switch signal output for digital output.

The anisotropy field Hk of the free layer and the external magnetic field Hex applied to a linear TMR magnetoresistive sensor are perpendicular to each other, and the magnetization direction of a reference layer is perpendicular to the magnetization direction of the free layer. When the freelayer is exposed to an external magnetic field Hex, the free layer magnetization will rotate towards Hex. The magnetization direction of the free layer is rotated from an angle of 90 degrees with the magnetization direction of the reference layer to an angle of 0 degrees. When the external magnetic field is reversed to −Hex, the magnetization direction of the free layer is rotated to an angle of 180 degrees. In this angular range, the magnetoresistance is linearly dependent on H. On the other hand, when the direction of the anisotropy field Hk of the free layer is parallel with the direction of the external magnetic field Hex, and the magnetization direction of the reference layer is set parallel to the magnetization direction of the free layer, when the external magnetic field Hex is increased the free layer magnetic moment M will not change. Additionally, when the external magnetic field is reversed to −Hex, when the amplitude of the reverse external magnetic field −Hex is less than Hk, the free layer magnetic moment M remains unchanged. At this time, the M angle is 0 degrees. When the amplitude of the reverse external magnetic field −Hex is close to Hk, the free layer magnetic moment M will suddenly reverse to −M, such that the angle is 180 degrees. As such, a rectangular hysteresis loop is formed, and the corresponding R versus H curve is also characterized by a rectangular hysteresis loop, thereby providing a new type of bipolar hysteretic magnetoresistive switch sensor.

The freelayer of this bipolar hysteretic magnetoresistive sensor has two stable states for the magnetization direction M under the condition of 0 applied external magnetic field, that is, the states where an angle with the magnetization direction of the reference layer is 0 degrees and 180 degrees, depending on the direction of the external magnetic field Hex applied before the removal of the external magnetic field.

Therefore, in order to ensure the consistency of the magnetization direction M of the free layer during each measurement, a reset coil can be used to generate a reset magnetic field Hr, which acts on the N or S direction, and it can be selected to excite the Hr before the start of the measurement or after the completion of the measurement, so that the magnetization direction M of the free layer is known.

For the TMR linear switch magnetoresistive sensor bridge, a push magnetoresistive sensing unit chip with a single magnetic field sensing direction such as the X-axis is generally used and flipped by 180 degrees to obtain an X-axis pull magnetoresistive sensing unit chip, and then the two chips are connected by wire bonding, which has the advantage that the preparation method is simple, the chip only needs to correspond to a ferromagnetic reference layer structure, and the disadvantage that the two chips need to be operated for precise positioning in the same plane, thus increasing the possibility of loss of sensor measurement accuracy due to operating errors.

The Chinese patent application No. CN201610821610.7 discloses a method of using a laser-programmed heating magnetic field annealing method to scan magnetoresistive sensing units, and rapidly heat an antiferromagnetic layer to above a blocking temperature. At the same time, during cooling, a magnetic field can be applied in any direction, and the orientation of the magnetoresistive sensing units in the magnetic field sensing direction in any direction can be realized by scanning one by one or even chip by chip. This method can realize the manufacturing of magnetoresistive sensing units on a single chip with opposite orientations of single-axis the magnetoresistive sensing units, and arrays thereof, thus overcoming the problem of precise positioning of flipped chips, and realizing batch manufacturing of single-chip magnetoresistive bridges.

In addition, a GMR spin valve structure works in a CIP mode, that is, the operating current is parallel to the plane of a magnetic multilayer film, so that a change in the thickness of a free layer can cause a large change in the sensor resistance. Therefore, the thickness change thereof is limited, so that Hc cannot be easily controlled. The TMR sensor works in a CPP mode, that is, the current is perpendicular to the plane of the magnetic multilayer film, so that a TMR unit can be easily patterned to obtain a small elliptical shape, the control of the free layer thickness will not reduce the performance of the TMR sensor, and the Hc can be easily controlled. In addition, compared with the GMR spin valve, the TMR has lower power consumption, higher magnetic field sensitivity, and smaller size.

SUMMARY OF THE INVENTION

Therefore, based on the comparison of the above various types of magnetoresistive sensors, switch operating principles, and magnetic field annealing methods, and in order to solve the problem of an initial state of a switch, the present invention proposes a resettable bipolar switch sensor, including: a bipolar magnetic hysteresis switch sensor, the bipolar magnetic hysteresis switch sensor including: a substrate and one or more magnetoresistive sensing arms located on the substrate, wherein the magnetoresistive sensing arm is of a two-port structure composed of one or more magnetoresistive sensing unit strings arranged in series, parallel, or series-parallel, the magnetoresistive sensing unit string includes one or more magnetoresistive sensing units arranged in series, the magnetoresistive sensing unit is a TMR sensing unit including: a passivation layer, an upper electrode layer, a free layer, an intermediate insulating layer, a reference layer, an antiferromagnetic layer, and a seed layer, wherein the seed layer and the antiferromagnetic layer constitute a lower electrode layer, the magnetization direction of the free layer, the magnetic field sensing direction, and the magnetization direction of the reference layer can all orient in a N or S direction, and the magnetization direction of the free layer is only determined by an anisotropy field Hk; a reset coil located between the substrate and the magnetoresistive sensing unit, or on a lead frame below the substrate, wherein the directions of reset magnetic fields acting on all the magnetoresistive sensing units are all either N or S; an ASIC switch circuit including a biasing circuit module, a reading circuit module, and an output circuit module, wherein the biasing circuit module is connected to the magnetic hysteresis switch sensor and power supply terminals of the reading module and the function module, the reading circuit module is connected to a signal output terminal of the magnetic hysteresis switch sensor, and the output circuit module is connected to the reading circuit module; and a power reset circuit connected to the reset coil.

The magnetoresistive sensing unit is in a shape of an ellipse, a rhombus, or a biaxially symmetrical shape with the middle rectangular and both ends tapered, the long axis L being in a N or S direction, and the short axis being W; the intermediate insulating layer is a material of Al2O3 or MgO; the free layer is a high anisotropy field, that is Hk, material; when a laser programming process is used, the passivation layer is a material transparent to laser light, the material of the upper electrode layer is a conductive metal material of Cu, Al, Au, Ti or Ta with a thickness of at least 150 nm to prevent laser damage, and the antiferromagnetic layer is a material with high blocking temperature, when the magnetoresistive sensing units are interconnected by the lower electrode layer for a long distance, the area where the lower electrode layer is located is covered by the area where the upper electrode layer is located, so as to protect the lower electrode layer from laser damage; the reset coil is a high-conductivity material of Cu, Ta, Au, or Al; and the reset wires located on the substrate are electrically isolated from the magnetoresistive sensing units by an insulating layer.

The magnetization directions of the reference layers of the magnetoresistive sensing units included in any of the magnetoresistive sensing arms are all either N or S, and the anisotropy field Hk directions of the free layers are all either N or S, so as to obtain magnetoresistive sensing arms of four different types, namely, $N_rN_f$, $N_rS_f$, $S_rN_f$, and $S_rS_f$.

The bipolar magnetic hysteresis switch sensor is of a single-chip structure and composed of magnetoresistive sensing arms of the $N_rN_f$, $N_rS_f$, $S_rN_f$, or $S_rS_f$ type, under the action of an external magnetic field Hex with the same orientation in the N or S direction, $N_rN_f$ and $N_rS_f$ are N bipolar magnetic hysteresis switch sensors with the same switch level-magnetic field characteristics, $S_rN_f$ and $S_rS_f$ are S bipolar magnetic hysteresis switch sensors with the same switch level-magnetic field characteristics, and the N and S bipolar magnetic hysteresis switch sensors have opposite switch phase features; or the bipolar magnetic hysteresis switch sensor is of a push-pull bridge structure composed of the $N_rN_f$ push or pull magnetoresistive sensing arm and the $S_rN_f$ pull or push magnetoresistive sensing arm, or the $N_rS_f$ push or pull magnetoresistive sensing arm and the $S_rS_f$ pull or push magnetoresistive sensing arm, and the push-pull bridge structure is a half bridge, a full bridge, or a quasi bridge.

The bipolar magnetic hysteresis switch sensor is of a multi-chip structure, including push magnetoresistive sensing arm chips and pull magnetoresistive sensing arm chips, the push magnetoresistive sensing arm chips and the pull magnetoresistive sensing arm chips respectively correspond to the magnetoresistive sensing arm chips of the $N_rN_f$, $N_rS_f$, $S_rN_f$, or $S_rS_f$ type and chips obtained by flipping the phase by 180 degrees, the magnetization directions of the free layers of the push magnetoresistive sensing arm and the pull magnetoresistive sensing arm are made to be the same under the action of a reset magnetic field in the N or S direction, so that $N_rN_f$ push or pull magnetoresistive sensing arm chips and $S_rN_f$ pull or push magnetoresistive sensing arm chips, or $N_rS_f$ push or pull magnetoresistive sensing arm chips and $S_rS_f$ pull or push magnetoresistive sensing arm chips are bound and interconnected to form the push-pull bridge structure, and the push-pull bridge structure may be a half bridge, a full bridge, or a quasi bridge.

When the magnetization directions of the antiferromagnetic layers of the magnetoresistive sensing units are all the same, the antiferromagnetic magnetization directions of the magnetoresistive sensing units may be written by using a laser programming process or an annealing furnace magnetic annealing process; the magnetoresistive sensing units with the same antiferromagnetic layer orientation respectively form a push arm area and a pull arm area, and when the push-pull bridge structure is a full bridge, it includes two push arm areas and two pull arm areas, the two push arm areas and the two pull arm areas are adjacent to each other, or the two push arm areas and the two pull arm areas are respectively mixed into a combined push arm area and a combined pull arm area, and between the push arm areas and the pull arm areas, the combined push arm area and the combined arm area are separated by at least 50 um by a thermal insulating layer; and when the push-pull bridge structure is a half bridge, the push arm area and the pull arm area are separated by at least 50 um by a thermal insulating layer, and the magnetization directions of the antiferromagnetic layers of the push magnetoresistive sensing units and the pull magnetoresistive sensing units are written by a laser programming process.

For the push magnetoresistive sensing arm chip or the pull magnetoresistive sensing arm chip, the antiferromagnetic magnetization directions of the magnetoresistive sensing units may be written by using a laser programming process or an annealing furnace magnetic annealing process.

When the reset coil is located between the substrate and the magnetoresistive sensing unit, the reset coil includes reset wires arranged in parallel, the reset wires are located directly below the magnetoresistive sensing unit and are perpendicular to the NS direction, and the reset currents in the reset wires have the same magnitude and direction.

When the reset coil is located on a lead frame below the substrate, the reset coil is spiral and includes at least one straight line segment area arranged in parallel, the reset currents in the straight line segment area have the same direction and amplitude, and are perpendicular to the N-S direction, and the magnetoresistive sensing units are all located directly above the straight line segment area.

The ASIC biasing circuit module is a current source with a temperature compensation function, and when a push-pull half-bridge or full-bridge structure is adopted, the ASIC biasing circuit module is a voltage source with a temperature compensation function.

The ASIC reading circuit module includes a comparator, when the magnetic hysteresis switch sensor is of a half-bridge structure, an output signal is directly connected to one end of the signal comparator, and the other end is a reference signal; and when it is of a full-bridge structure, the output signal is directly connected to both ends of the signal comparator.

The ASIC reading circuit module further includes a filter and an amplifier that are connected to the signal output terminal of the magnetic hysteresis switch sensor, as well as a latch and a buffer that are connected to the comparator.

The ASIC output circuit module is a current switch, a voltage switch, a resistance switch, or another switch.

The magnetic hysteresis switch sensor is directly deposited on a top layer of the ASIC switch circuit, or the magnetic hysteresis switch sensor and the ASIC switch circuit are connected by binding, the reset current in the reset circuit is a direct current or a pulse current, the reset circuit may be an ASIC reset circuit or a PCB reset circuit, and the ASIC switch circuit and the ASIC reset circuit may be integrated into an ASIC switch reset circuit.

An operating magnetic field of the magnetic hysteresis switch sensor is 60-80% of the amplitude of a switch rising voltage, and a return magnetic field is 60-80% of the amplitude of a switch drop voltage.

Compared with the prior art, the present invention adopts the above scheme and has the following beneficial effects:

The present invention has the characteristics of low power consumption, small size, and presettable initial state of the switch sensor.

DESCRIPTION OF THE DRAWINGS

The drawings incorporated into the specification constitute a part of the specification, showing embodiments that conform to the present application, and are used together with the specification to explain the principle of the present application. Other features, purposes, and advantages of the present invention will be more obvious by reading the detailed description of non-limiting embodiments made with reference to the following accompanying drawings. It is apparent that the accompanying drawings in the following description are only some embodiments of the present invention. For those of ordinary skill in the art, other accompanying drawings can be obtained based on these accompanying drawings without creative effort.

FIG. 4A1, FIG. 4A2, FIG. 4A3, and FIG. 4A4 are $N_rN_f$, $N_rS_f$, $S_rN_f$, and $S_rS_f$ magnetic orientation diagrams of a single-arm bipolar magnetic hysteresis switch sensor, respectively;

FIG. 4B1, FIG. 4B2, FIG. 4B3, and FIG. 4B4 are switch level-magnetic field feature curve diagrams corresponding to $N_rN_f$, $N_rS_f$, $S_rN_f$, and $S_rS_f$ magnetic orientations of the single-arm bipolar magnetic hysteresis switch sensor, respectively;

FIG. 5 is a diagram of magnetic orientation and switch level features of a push-pull bipolar magnetic hysteresis switch sensor;

FIG. 14 is a topology of a resettable bipolar switch sensor.

DETAILED DESCRIPTION

In order to make the objectives, technical solutions, and advantages of the embodiments of the present invention clearer, the technical solutions in the embodiments of the present invention will be described clearly and completely below with reference to the accompanying drawings in the embodiments of the present invention. It is apparent that the described embodiments are a part of, not all, the embodiments of the present invention.

The present invention will be described in detail below with reference to the accompanying drawings and the embodiments.

Figure 1:
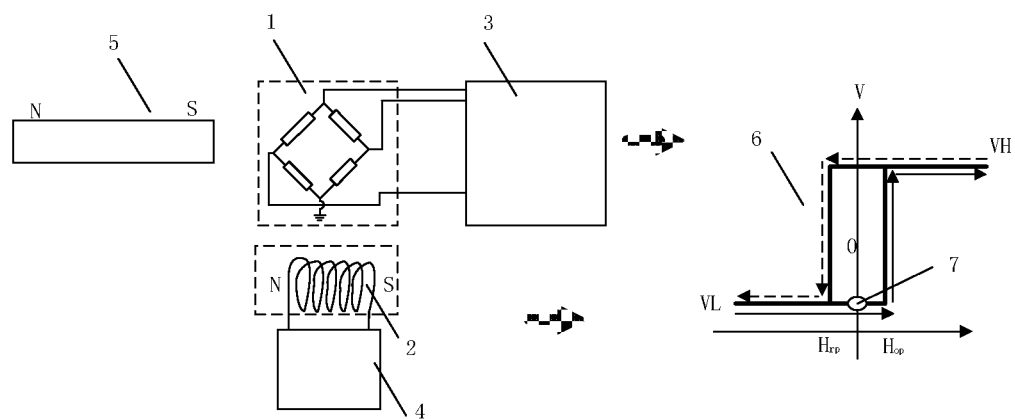
FIG. 1 is a schematic diagram of a resettable bipolar switch sensor working group.

FIG. 1 is a working principle diagram of a resettable bipolar switch sensor, wherein 1 denotes a bipolar magnetic hysteresis switch sensor, 2 denotes a reset coil, 3 denotes an ASIC switch circuit, 4 denotes a reset circuit, and 5 denotes an external magnetic field. In this example, it is a square hard magnet with a N magnetic pole and an S magnetic pole. For convenience, an external magnetic field Hex is specified in the N direction and the S direction. In addition, for the magnetic field sensing direction of the bipolar magnetic hysteresis switch sensor, the magnetization direction of the magnetic layer is based on the N or S direction. External magnetic field 5 acts on magnetoresistive sensor 1, and is converted into bipolar switch level-magnetic field signal 6 by ASIC switch circuit 3. According to the different directions of the external magnetic field N and S, there may be two levels, i.e., VH and VL. In order to ensure the certainty of the switch in a 0 magnetic field state before use, for example, maintaining the output level before use in the VL state in 7, before each use or after stopping use, reset coil 2 can be powered by reset power supply 4 to generate a reset magnetic field acting on bipolar magnetic hysteresis switch sensor 1, so that bipolar magnetic hysteresis switch sensor 1 is in the 7 state.

Figures 2A, 2B:
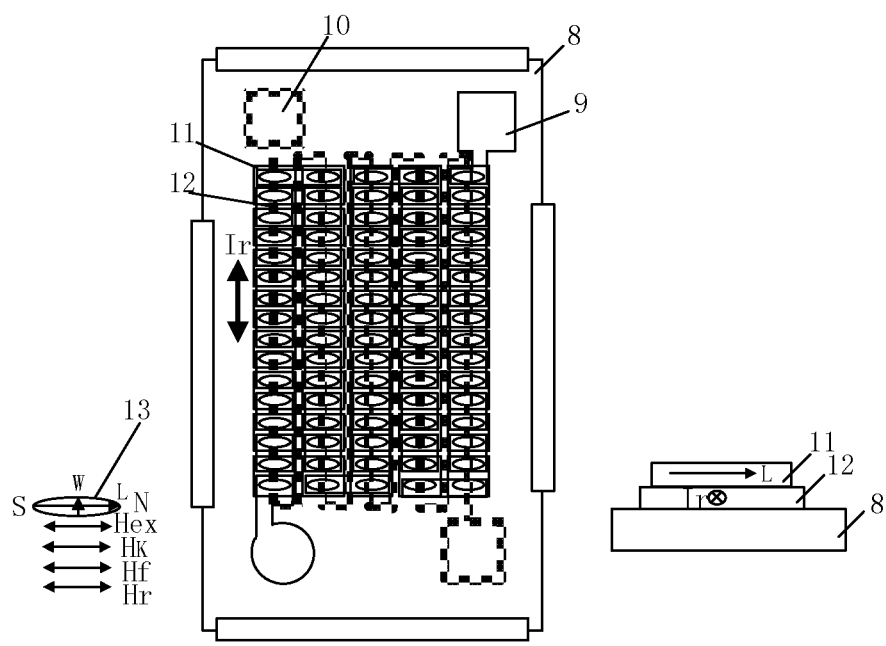
FIG. 2A and FIG. 2B are respectively a plan view and a cross-sectional view of a single-chip resettable bipolar switch sensor structure.
Figure 3:
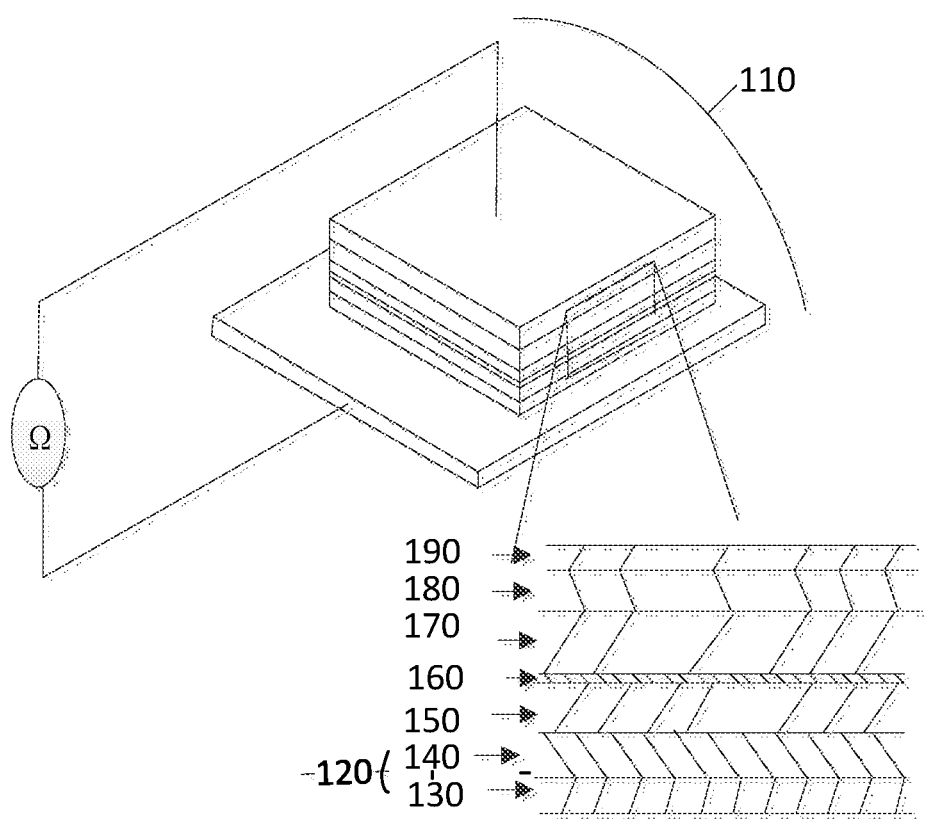
FIG. 3 is a diagram of a multilayer film structure of a TMR magnetoresistive sensing unit.

FIG. 2a and FIG. 2b show two ports and a single-chip structure of a single magnetoresistive sensing arm of a bipolar magnetic hysteresis switch sensor. FIG. 2a is a plan view, in which 8 denotes a substrate, 9 denotes a magnetoresistive sensing unit arm located on substrate 8, and magnetoresistive sensing unit arm 9 is of a two-port structure composed of one or more magnetoresistive sensing unit strings 11 arranged in series, parallel, or series-parallel. The magnetoresistive sensing unit string includes one or more magnetoresistive sensing units 13 arranged in series. The magnetoresistive sensing unit 13 may be in a shape of an ellipse, a rhombus, or a biaxially symmetrical shape with the middle rectangular and both ends tapered, the long axis L being in a N or S direction, and the short axis being W. FIG. 3 is a structural diagram of multilayer film 110 of a TMR sensing unit, including: passivation layer 190, upper electrode layer 180, free layer 170, intermediate insulating layer 160, reference layer 150, antiferromagnetic layer 140, and seed layer 130. Seed layer 140 and antiferromagnetic layer 130 constitute lower electrode layer 120, intermediate insulating layer 160 is a material of Al2O3 or MgO, antiferromagnetic layer 140 is a material with high blocking temperature, free layer 170 is a high anisotropy field Hk, and 10 denotes reset coil 10 located between substrate 8 and magnetoresistive sensing unit string 9. Reset coil 10 includes a plurality of reset wires 12 arranged in parallel. FIG. 2b is a cross-sectional view. It can be seen that reset wires 12 are located between magnetoresistive sensing unit string 11 and substrate 8, and are located directly below magnetoresistive sensing unit string 11. The reset current direction Ir is perpendicular to the L direction of magnetoresistive sensing unit 13, and the reset wires corresponding to any magnetoresistive sensing unit string have the same current direction and amplitude. The reset wires in FIG. 2a and FIG. 2b are connected in series to ensure the same current amplitude, and ensure the same current direction by a zigzag structure.

When two opposite directions of N and S of external magnetic field source 5 in FIG. 1 are used as reference directions to define other directions, as shown in magnetoresistive sensing unit 13 in FIG. 2a, the long axis L is in the N or S direction, the magnetization direction Hf of free layer 170, the magnetic field sensing direction Hex, and the magnetization direction Hr of reference layer 150 in the multilayer structure in FIG. 3 are all in the N direction or the S direction. When the magnetization intensity Hf of free layer 170 is only determined by the anisotropy field Hk, a bipolar magnetic hysteresis switch sensor is formed.

In order to facilitate the description of the magnetoresistive sensing unit structure of various types of bipolar magnetic hysteresis switch sensors, the following type identifiers are defined:

$N_r S_f$

N, S represent orientation, N represents that the direction has the same orientation as the N pole of the external magnetic field source, and S represents the same orientation as the S pole of the external magnetic field source.

The subscript r represents the reference layer, and f represents the free layer.

$N_r S_f$ indicates that the orientation of the reference layer is N and the orientation of the free layer is S.

On the other hand, since all magnetoresistive sensing units of different orientations are located on the same substrate, they are affected by the same external magnetic field. Therefore, in the following analysis, the direction of the external magnetic field remains the same.

The magnetoresistive sensing arms included in the bipolar magnetic hysteresis switch sensor can be classified into 4 types according to the difference between the magnetization directions of the free layer and the reference layer. Type identifiers are shown in Table 1. There are four types, namely, $N_r N_f$, $N_r S_f$, $S_r N_f$, and $S_r S_f$, and a corresponding magnetoresistive sensing unit orientation diagram and a switch level-magnetic field feature curve are shown in FIG. 4. It can be seen from the drawing that the $N_r N_f$ orientation diagram in FIG. 4a1 and the $N_r S_f$ orientation diagram in FIG. 4a2 have opposite free layer orientations Hf and the same reference layer orientation Hr, but the switch level-magnetic field feature curve in FIG. 4b1 is the same as the switch level-magnetic field feature curve in FIG. 4b2. In fact, the orientation diagrams shown in FIG. 4a1 and FIG. 4a2 are the two orientation diagrams corresponding to the same switch level-magnetic field feature curve at two switch levels. Therefore, $N_r N_f$ and $N_r S_f$ can be regarded as a N-bipolar magnetic hysteresis switch sensor. Similarly, orientation diagrams shown in FIG. 4a3 and FIG. 4a4 corresponding to the same switch level-magnetic field feature curves shown in FIG. 4b3 and FIG. 4b4, and therefore, $S_r N_f$, and $S_r S_f$ can be regarded as an S-bipolar magnetic hysteresis switch sensor. It can also be seen that the S-bipolar magnetic hysteresis switch sensor and the N-bipolar magnetic hysteresis switch sensor have switch level-magnetic field features having opposite phases. That is, the external magnetic field orientations corresponding to the high and low levels are opposite.

TABLE 1

| Hr | | Hf | |
|---|---|---|---|
| N | S | N | S |
| Nr | | Nf | |
| | | | Sf |
| | Sr | Nf | |
| | | | Sf |

Therefore, the bipolar magnetic hysteresis switch sensor may include a single magnetoresistive sensing arm composed of a single-oriented magnetoresistive sensing units. The magnetoresistive sensing unit is one of $N_r N_f$, $N_r S_f$, $S_r N_f$, and $S_r S_f$, and its structure is shown in FIG. 2a and FIG. 2b.

FIG. 5 is a push-pull structural diagram of a bipolar magnetic hysteresis switch sensor. Two magnetoresistive sensing arms with opposite phases are used as a push arm and a pull arm to form a push-pull structure, thereby obtaining an enhanced signal output. As shown in FIG. 5a1, the $N_r S_f$ and $S_r S_f$ magnetoresistive sensing arms are used as R02 and R01 arms of the push-pull half-bridge structure, respectively. FIG. 5b1 and FIG. 6c1 are orientation diagrams of $N_r S_f$ and $S_r S_f$ magnetoresistive sensing units, respectively. It can be seen that the free layer magnetic fields Hf have the same direction, while the reference layer magnetization directions Hr have different orientations. In the following analysis, in the magnetic hysteresis switch sensor structure including multiple magnetoresistive sensing arms, the free layer magnetic field Hf orientation is defined to be the same, and therefore, since free layer Hk orientations on the same wafer are obtained by the same manufacturing process, they are consistent, and it is relatively difficult to manipulate the opposite direction orientation of the free layer of some magnetoresistive sensing units. FIG. 5d1 and FIG. 5e1 are switch level-magnetic field feature curves of $N_rS_f$ and $S_rS_f$ with opposite phases. Therefore, the switch level-magnetic field feature curve of the push-pull bipolar magnetic hysteresis switch sensor shown in FIG. 5*f*1 will have the amplitude twice as much as the switch level-magnetic field feature curve corresponding to FIG. 5*d*1 and FIG. 5*e*1.

Similarly, $S_rN_f$ and $N_rN_f$ magnetoresistive sensing arms in FIG. 5*a*2 are respectively used as R01 and R02 arms of the push-pull half-bridge structure. FIG. 5*b*2 and FIG. 5*c*2 are the orientation diagrams of $S_rN_f$ and $N_rN_f$ magnetoresistive sensing units, respectively. It can also be seen that the free layer magnetic field Hf has the same direction, while the reference layer magnetization direction Hr has different orientations, and the switch level-magnetic field feature curve of the push-pull bipolar magnetic hysteresis switch sensor shown in FIG. 5*f*2 will have the amplitude twice as much as the switch level-magnetic field feature curve corresponding to FIG. 5*d*2 and FIG. 5*e*2. In addition to a half bridge, the bipolar push-pull magnetic hysteresis switch sensor can have a full-bridge or a quasi-bridge structure.

Figure 6:
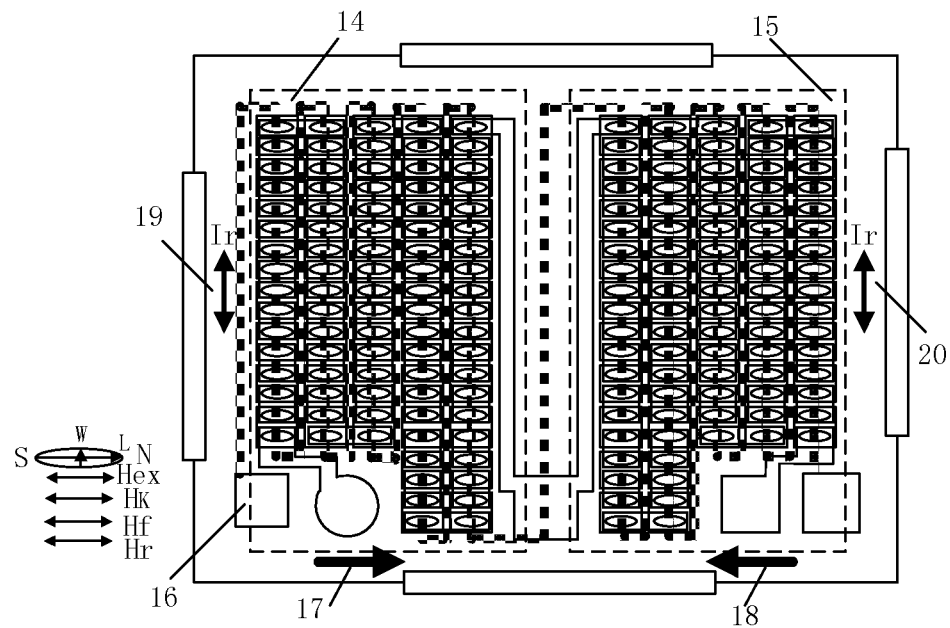
FIG. 6 is a structural diagram of another single-chip resettable bipolar switch sensor.

FIG. 6 is a structural diagram of a resettable push-pull bipolar magnetic hysteresis switch sensor including push-pull magnetoresistive sensing arms. Two magnetoresistive sensing arms 14 and 15 are included, and reference layer magnetization directions 17 and 18 corresponding to the two magnetoresistive sensing arms have opposite directions, free layer magnetization directions are the same, and the two magnetoresistive sensing arms form a push-pull bridge structure. 16 denotes a reset coil, similar in structure to resettable coil 10 corresponding to the single magnetoresistive sensing arm as shown in FIG. 2*a* and FIG. 2*b*. Reset currents 19 corresponding to all push magnetoresistive sensing unit strings and reset currents 20 corresponding to all pull magnetoresistive sensing unit strings have the same direction and the same current amplitude.

Figure 7:
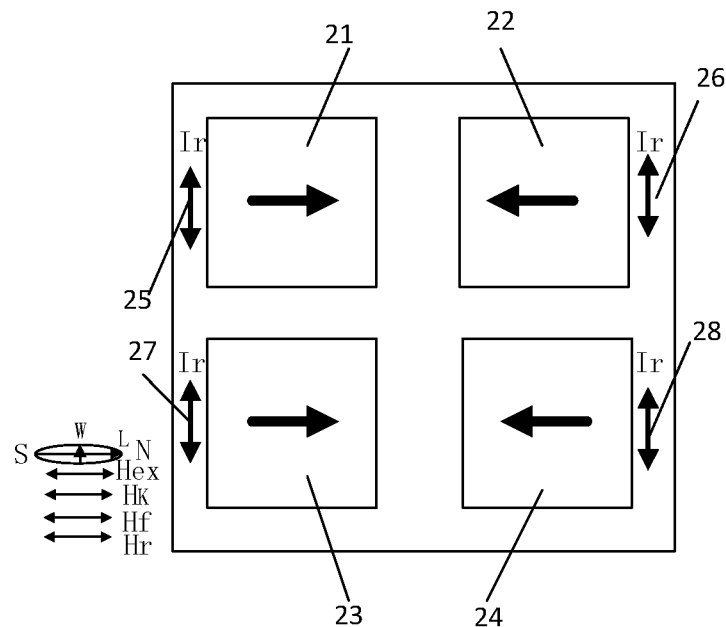
FIG. 7 is a structural diagram of still another single-chip resettable bipolar switch sensor.

FIG. 7 is a brief diagram of a resettable push-pull full-bridge bipolar magnetic hysteresis switch sensor including four magnetoresistive sensing arms 21, 22, 23 and 24, in which push magnetoresistive sensing arms 21, 23 and pull magnetoresistive sensing arms 22, 24 have opposite reference layer directions, and reset coils 25, 26, 27, 28 corresponding to magnetoresistive sensing arms 21, 23 and magnetoresistive sensing arms 22, 24 also have the same reset current Ir direction and current amplitude with respect to the push magnetoresistive sensing unit string and the pull magnetoresistive sensing unit string.

FIG. 6 and FIG. 7 need to use the laser programming process to realize a writing operation of opposite antiferromagnetic layer magnetization directions of the push magnetoresistive sensing unit arm and the pull magnetoresistive sensing unit arm, so as to realize the single-chip structure.

Figures 8A, 8B, 8C:
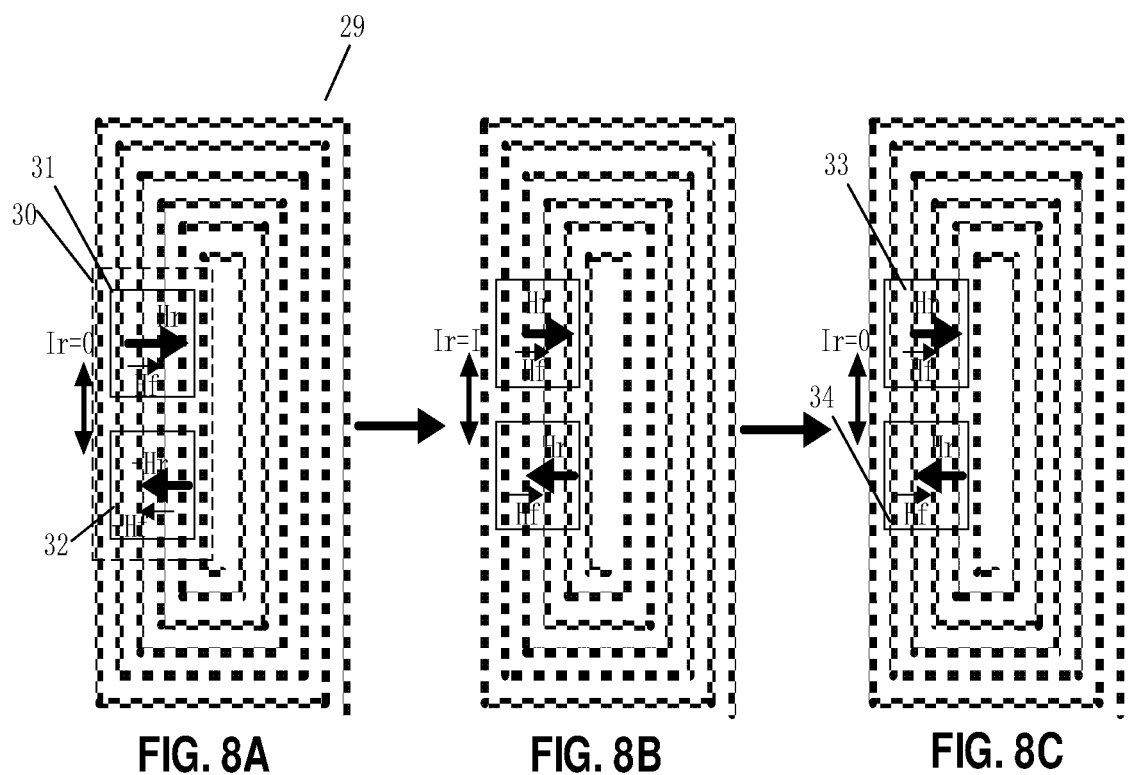
FIG. 8 is a structural diagram of a multi-chip resettable bipolar switch sensor.

FIG. 8 is a resettable bipolar magnetic hysteresis push-pull magnetoresistive sensor structure prepared by a flip-slicing method, in which 29 denotes a reset coil of a spiral structure, and excitation area 30 includes reset wires arranged in parallel and having the same current direction and spacing. Two chips 31 and 32 each including a single magnetoresistive sensing unit arm have phases flipped 180 degrees each, and in the initial Ir=0 state shown in FIG. 8*a*, the reference layer magnetization directions Hr are opposite, the free layer magnetization directions Hr are opposite and are perpendicular to the reset wire direction. After the excited state Ir=I shown in FIG. 8*b*, the free layer magnetization directions of the two chips have the same direction. In FIG. 8*c*, after the removal current Ir=0, the free layer magnetization directions of the two chips are kept the same, thereby obtaining a flip-chip bipolar magnetic hysteresis push-pull magnetoresistive switch sensor including a reset coil.

Similarly, the single-chip bipolar magnetic hysteresis push-pull magnetoresistive switch sensor shown in FIG. 2, FIG. 6 and FIG. 7 can be placed in area 30 of coil 29 shown in FIG. 8, and the reset coil located between the substrate and the magnetoresistive sensing unit is replaced, which can also realize a resettable single-chip bipolar magnetic hysteresis push-pull magnetoresistive switch sensor.

Figure 9:
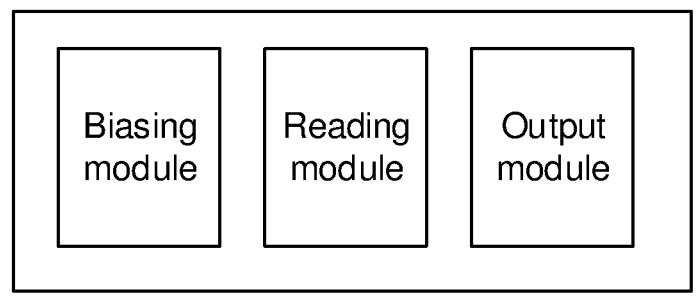
FIG. 9 is a structural diagram of an ASIC switch circuit.

FIG. 9 is a structural diagram of the ASIC circuit, including a biasing circuit module, a reading circuit module, and an output circuit module. The biasing circuit module is connected to the magnetic hysteresis switch sensor, and power supply terminals of the reading module and the function module. The reading circuit module is connected to a signal output terminal of the magnetic hysteresis switch sensor, and the output circuit module is connected to the reading circuit module.

Figures 10A, 10B, 10C:
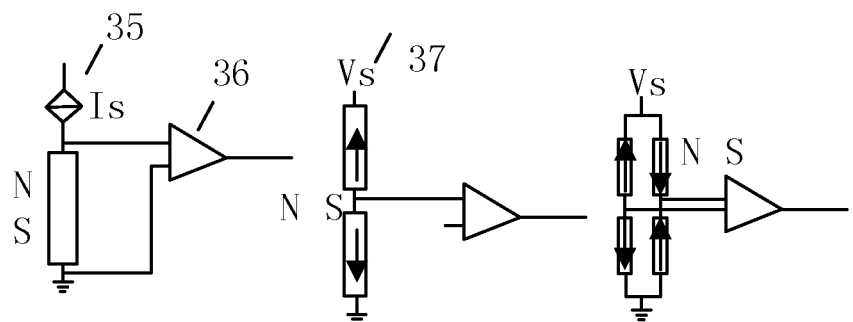
FIG. 10 is a diagram of a power supply and a signal output of a bipolar magnetic hysteresis switch sensor.

FIG. 10 is a connection diagram of a biasing circuit module and a magnetic hysteresis switch sensor. For a unipolar magnetic hysteresis switch sensor and a bipolar magnetic hysteresis switch sensor including a single magnetoresistive sensing arm, the ASIC biasing circuit module may be current source 35. For a push-pull magnetic hysteresis switch sensor, the ASIC biasing circuit module may be voltage source 37, and both the voltage source and the current source have a temperature compensation function. The reading circuit module includes comparator 36. When the push-pull magnetic hysteresis switch sensor is of a half-bridge structure, an output signal is directly connected to one end of the signal comparator, and the other end is a reference signal, as shown in FIG. 10*b*. When the push-pull magnetic hysteresis switch sensor is of a full-bridge structure, the output signal is directly connected to the two ends of the signal comparator, as shown in FIG. 10*c*. The ASIC reading circuit module also includes a filter and an amplifier that are connected to the signal output terminal of the magnetic hysteresis switch sensor, and a latch and a buffer that are connected to the comparator.

Figure 11:
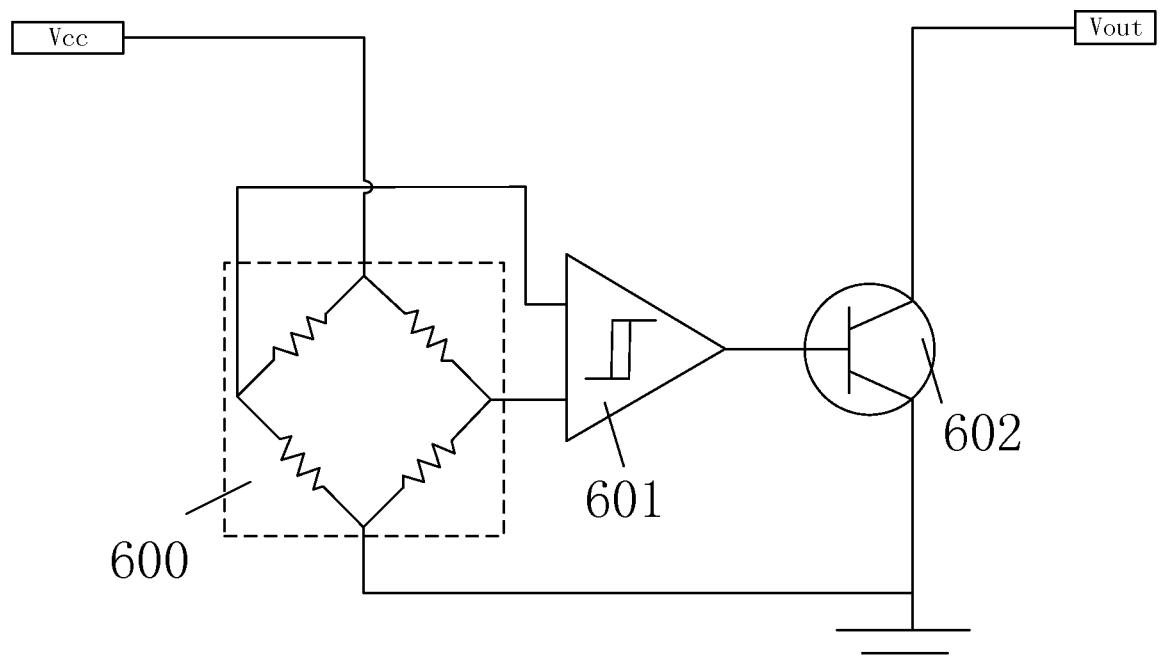
FIG. 11 is a circuit diagram of a bipolar magnetic hysteresis switch sensor.

FIG. 11 is a typical push-pull full-bridge magnetic hysteresis switch sensor, in which 600 denotes a full-bridge push-pull sensor, 601 denotes a comparator, and 602 denotes an output circuit module, which may be a current switch, a voltage switch, a resistance switch, or another switch.

Figure 12:
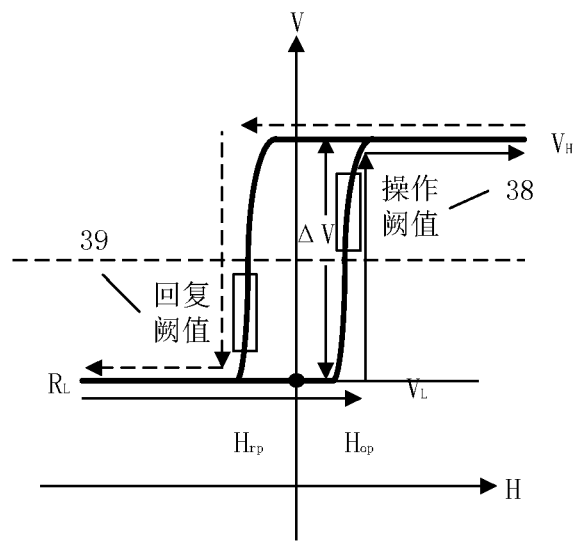
FIG. 12 is a threshold diagram of a bipolar magnetic hysteresis switch sensor.

FIG. 12 is a diagram of an operating magnetic field threshold of a bipolar magnetic hysteresis switch sensor, in which a switching operation Hop is 60-80% of voltage amplitude threshold (operation threshold) 38, and a return magnetic field Hrp is 60-80% of the amplitude of switch drop voltage (return threshold) 39.

Figure 13A:
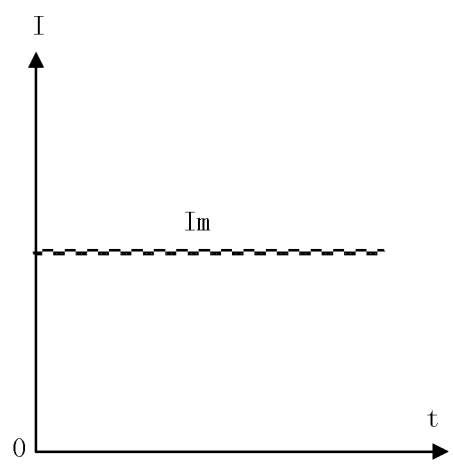
FIG. 13 is a diagram of a reset power supply signal.
Figure 13B:
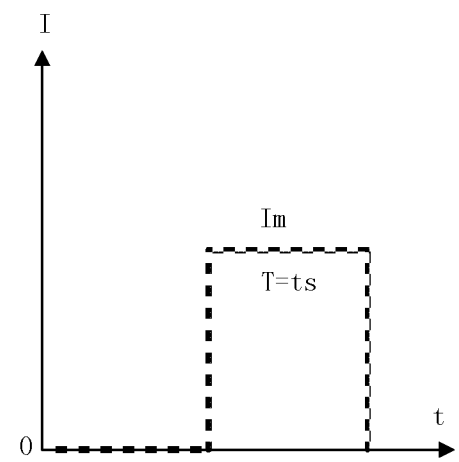

FIG. 13 is a waveform diagram of the reset current, which has two forms, i.e., the DC current shown in FIG. 13*a* and the pulse current form shown in FIG. 13*b*, with the amplitude Im and the duration tm.

FIG. 14 is a connection diagram of a magnetic hysteresis switch sensor, an ASIC switch circuit, and a reset circuit. Bipolar magnetic hysteresis switch sensor 40 in FIG. 14*a* can be directly deposited on top layers of ASIC switch circuit 50 and the ASIC reset circuit, or in FIG. 14*b*, magnetic hysteresis switch sensor 40, the ASIC switch circuit, and ASIC reset circuit 50 are connected through binding 60. The ASIC switch circuit and the reset circuit are both ASIC circuits. In FIG. 14*c*, bipolar magnetic hysteresis switch sensor 40 is directly deposited on the top layer of ASIC switch circuit 50, and the reset circuit is a PCB circuit.

In FIG. 14d, magnetic hysteresis switch sensor 40 and the ASIC switch circuit are connected by binding 60, and the reset circuit is a PCB circuit.

In the present invention, when the magnetization directions of the antiferromagnetic layers of the magnetoresistive sensing units are the same in the single-chip structure, the laser programming process or the annealing furnace magnetic annealing process can be used to write the antiferromagnetic magnetization direction of the magnetoresistive sensing unit. The magnetoresistive sensing units with the same antiferromagnetic layer orientation respectively form a push arm area and a pull arm area. When the push-pull bridge structure is a full bridge, two push arm areas and two pull arm areas are included, and the two push arm areas and the two pull arm areas are adjacent to each other, or the two push arm areas and the two pull arm areas are respectively mixed into a combined push arm area and a combined pull arm area, and between the push arm areas and the pull arm areas, the combined push arm area and the combined arm area are separated by at least 50 um by a thermal insulating layer. When the push-pull bridge structure is a half bridge, the push arm area and the pull arm area are separated by at least 50 um by a thermal insulating layer. The magnetization directions of the antiferromagnetic layers of the push magnetoresistive sensing units and the pull magnetoresistive sensing units are written by a laser programming process. When a flip-flop chip structure is used, for the push magnetoresistive sensing arm chip or the pull magnetoresistive sensing arm chip, the antiferromagnetic magnetization directions of the magnetoresistive sensing units are written by using a laser programming process or an annealing furnace magnetic annealing process.

When a laser programming process is used, the passivation layer is a material transparent to laser, the material of the upper electrode layer is a conductive metal material of Cu, Al, Au, Ti or Ta with a thickness of at least 150 nm to prevent laser damage, and the antiferromagnetic layer is a material with high blocking temperature. When the magnetoresistive sensing units are interconnected by the lower electrode layer for a long distance, the area where the lower electrode layer is located is covered by the area where the upper electrode layer is located, so as to protect the lower electrode layer from laser damage. The reset coil is a high-conductivity material of Cu, Ta, Au, or Al. The reset wires located on the substrate are electrically isolated from the magnetoresistive sensing units by an insulating layer.

The above content is a further detailed description of the present invention in combination with specific preferred embodiments, and it cannot be considered that the specific implementation of the present invention is limited to these descriptions. For those skilled in the art, it is obvious that the present application is not limited to the details of the foregoing example embodiments, and the present application can be implemented in other specific forms without departing from the spirit or basic features of the present application. Therefore, from any point of view, the embodiments should be regarded as exemplary and non-restrictive. The scope of the present application is defined by the appended claims rather than the above description, and therefore it is intended that all changes falling in the meaning and scope of equivalent elements of the claims are included in the present application. Any reference numerals in the claims should not be regarded as limiting the claims involved. In addition, it is obvious that the word "include" does not exclude other units or steps, and the singular does not exclude the plural.

The invention claimed is:

1. A resettable bipolar switch sensor, comprising:
a bipolar magnetic hysteresis switch sensor comprising:
a substrate; and
one or more magnetoresistive sensing arms located on the substrate,
wherein the magnetoresistive sensing arm is of a two-port structure composed of one or more magnetoresistive sensing unit strings arranged in series, parallel, or series-parallel, the magnetoresistive sensing unit string comprises one or more magnetoresistive sensing units arranged in series, the magnetoresistive sensing unit is a tunnel magnetoresistive (TMR) sensing unit comprising: a passivation layer, an upper electrode layer, a free layer, an intermediate insulating layer, a reference layer, an antiferromagnetic layer, and a seed layer, wherein the seed layer and the antiferromagnetic layer constitute a lower electrode layer, the magnetization direction of the free layer, the magnetic field sensing direction, and the magnetization direction of the reference layer are configured to be oriented in a N or S direction, and the magnetization direction of the free layer is only determined by an anisotropy field Hk;
a reset coil located between the substrate and the magnetoresistive sensing unit, or on a lead frame below the substrate, wherein the directions of reset magnetic fields acting on all the magnetoresistive sensing units are all either N or S;
an application-specific integrated circuit (ASIC) switch circuit comprising a biasing circuit module, a reading circuit module, and an output circuit module, wherein the biasing circuit module is connected to the magnetic hysteresis switch sensor and power supply terminals of the reading module and the function module, the reading circuit module is connected to a signal output terminal of the magnetic hysteresis switch sensor, and the output circuit module is connected to the reading circuit module; and
a power reset circuit connected to the reset coil.

2. The resettable bipolar switch sensor according to claim 1,
wherein the magnetoresistive sensing unit is in a shape of an ellipse, a rhombus, or a biaxially symmetrical shape with the middle rectangular and both ends tapered, the long axis L being in a N or S direction, and the short axis being W;
wherein the intermediate insulating layer is a material of $Al_2O_3$ or MgO;
wherein the free layer is a high anisotropy field Hk material;
wherein when a laser programming process is used, the passivation layer is a material transparent to laser, the material of the upper electrode layer is a conductive metal material of Cu, Al, Au, Ti or Ta with a thickness of at least 150 nm to prevent laser damage, and the antiferromagnetic layer is a material with high blocking temperature, when the magnetoresistive sensing units are interconnected by the lower electrode layer for a long distance, the area where the lower electrode layer is located is covered by the area where the upper electrode layer is located, so as to protect the lower electrode layer from laser damage;
wherein the reset coil is a high-conductivity material of Cu, Ta, Au, or Al; and
wherein the reset wires located on the substrate are electrically isolated from the magnetoresistive sensing units by an insulating layer.

3. The resettable bipolar switch sensor according to claim 1, wherein the magnetization directions of the reference layers of the magnetoresistive sensing units comprised in any of the magnetoresistive sensing arms are all either N or S, and the anisotropy field Hk directions of the free layers are all either N or S, so as to obtain magnetoresistive sensing arms of four different types, namely, $N_rN_f$, $N_rS_f$, $S_rN_f$, and $S_rS_f$, wherein subscript "r" represents "reference layer" and subscript "f" represents "free layer".

4. The resettable bipolar switch sensor according to claim 3, wherein the bipolar magnetic hysteresis switch sensor is of a single-chip structure and composed of magnetoresistive sensing arms of the $N_rN_f$, $N_rS_f$, $S_rN_f$, and $S_rS_f$, under the action of an external magnetic field Hex with the same orientation in the N or S direction, $N_rN_f$ and $N_rS_f$ are N bipolar magnetic hysteresis switch sensors with the same switch level-magnetic field characteristics, $S_rN_f$ and $S_rS_f$ are S bipolar magnetic hysteresis switch sensors with the same switch level-magnetic field characteristics, and the N and S bipolar magnetic hysteresis switch sensors have opposite switch phase features; or the bipolar magnetic hysteresis switch sensor is of a push-pull bridge structure composed of the $N_rN_f$ push or pull magnetoresistive sensing arm and the $S_rN_f$ pull or push magnetoresistive sensing arm, or the $N_rS_f$ push or pull magnetoresistive sensing arm and the $S_rS_f$ pull or push magnetoresistive sensing arm, and the push-pull bridge structure is a half bridge, a full bridge, or a quasi bridge.

5. The resettable bipolar switch sensor according to claim 3, wherein the bipolar magnetic hysteresis switch sensor is of a multi-chip structure, comprising push magnetoresistive sensing arm chips and pull magnetoresistive sensing arm chips, the push magnetoresistive sensing arm chips and the pull magnetoresistive sensing arm chips respectively correspond to the magnetoresistive sensing arm chips of the $N_rN_f$, $N_rS_f$, $S_rN_f$, or $S_rS_f$ type and chips obtained by flipping the phase by 180 degrees, the magnetization directions of the free layers of the push magnetoresistive sensing arm and the pull magnetoresistive sensing arm are made to be the same under the action of a reset magnetic field in the N or S direction, so that $N_rN_f$ push or pull magnetoresistive sensing arm chips and $S_rN_f$ pull or push magnetoresistive sensing arm chips, or $N_rS_f$ push or pull magnetoresistive sensing arm chips and $S_rS_f$ pull or push magnetoresistive sensing arm chips are bound and interconnected to form the push-pull bridge structure, and the push-pull bridge structure is a half bridge, a full bridge, or a quasi bridge.

6. The resettable bipolar switch sensor according to claim 4, wherein the magnetization directions of the antiferromagnetic layers of the magnetoresistive sensing units are all the same, and the antiferromagnetic magnetization directions of the magnetoresistive sensing units are written by using a laser programming process or an annealing furnace magnetic annealing process;
wherein the magnetoresistive sensing units with the same antiferromagnetic layer orientation respectively form a push arm area and a pull arm area,
wherein the push-pull bridge structure is a full bridge, comprising two push arm areas and two pull arm areas, and the two push arm areas and the two pull arm areas are adjacent to each other, or the two push arm areas and the two pull arm areas are respectively mixed into a combined push arm area and a combined pull arm area, and between the push arm areas and the pull arm areas, the combined push arm area and the combined arm area are separated by at least 50 um by a thermal insulating layer;
or, the push-pull bridge structure is a half bridge, and the push arm area and the pull arm area are separated by at least 50 um by a thermal insulating layer, and the magnetization directions of the antiferromagnetic layers of the push magnetoresistive sensing units and the pull magnetoresistive sensing units are written by a laser programming process.

7. The resettable bipolar switch sensor according to claim 4, wherein for the push magnetoresistive sensing arm chip or the pull magnetoresistive sensing arm chip, the antiferromagnetic magnetization directions of the magnetoresistive sensing units are written by using a laser programming process or an annealing furnace magnetic annealing process.

8. The resettable bipolar switch sensor according to claim 1, wherein the reset coil is located between the substrate and the magnetoresistive sensing unit, the reset coil comprises reset wires arranged in parallel, the reset wires are located directly below the magnetoresistive sensing unit and are perpendicular to the N-S direction, and the reset currents in the reset wires have the same magnitude and direction.

9. The resettable bipolar switch sensor according to claim 1, wherein the reset coil is located on a lead frame below the substrate, the reset coil is spiral and comprises at least one straight line segment area arranged in parallel, the reset currents in the straight line segment area have the same direction and amplitude and are perpendicular to the N-S direction, and the magnetoresistive sensing units are all located directly above the straight line segment area.

10. The resettable bipolar switch sensor according to claim 1, wherein the ASIC biasing circuit module is a current source with a temperature compensation function, and when a push-pull half-bridge or full-bridge structure is adopted, the ASIC biasing circuit module is a voltage source with a temperature compensation function.

11. The resettable bipolar switch sensor according to claim 1,
wherein the ASIC reading circuit module comprises a comparator;
wherein the magnetic hysteresis switch sensor is of a half-bridge structure, an output signal is directly connected to one end of the signal comparator, and the other end of the signal comparator is a reference signal; or,
wherein the magnetic hysteresis switch sensor is of a full-bridge structure, and the output signal is directly connected to both ends of the signal comparator.

12. The resettable bipolar switch sensor according to claim 1, wherein the ASIC reading circuit module further comprises a filter and an amplifier that are connected to the signal output terminal of the magnetic hysteresis switch sensor, as well as a latch and a buffer that are connected to the comparator.

13. The resettable bipolar switch sensor according to claim 1, wherein the ASIC output circuit module is a current switch, a voltage switch, or a resistance switch.

14. The resettable bipolar switch sensor according to claim 1, wherein the magnetic hysteresis switch sensor is directly deposited on a top layer of the ASIC switch circuit, or the magnetic hysteresis switch sensor and the ASIC switch circuit are connected by binding, the reset current in the reset circuit is a direct current or a pulse current, the reset circuit can be an ASIC reset circuit or a printed circuit board (PCB) reset circuit, and the ASIC switch circuit and the ASIC reset circuit can be integrated into an ASIC switch reset circuit.

15. The resettable bipolar switch sensor according to claim 1, wherein an operating magnetic field of the magnetic hysteresis switch sensor is 60-80% of the amplitude of a switch rising voltage, and a return magnetic field is 60-80% of the amplitude of a switch drop voltage.

* * * * *